United States Patent [19]

Soenen et al.

[11] Patent Number: 5,961,577
[45] Date of Patent: Oct. 5, 1999

[54] RANDOM BINARY NUMBER GENERATOR

[75] Inventors: Eric Soenen, Plano; Steve Martindell, Richardson, both of Tex.

[73] Assignee: Texas Instruments Incorporated, Dallas, Tex.

[21] Appl. No.: 08/985,937

[22] Filed: Dec. 5, 1997

Related U.S. Application Data

[60] Provisional application No. 60/032,548, Dec. 5, 1996.

[51] Int. Cl.[6] .................................................... G06F 7/58
[52] U.S. Cl. ........................................... 708/251; 708/255
[58] Field of Search .................................... 708/251, 255, 708/250; 331/78

[56] References Cited

U.S. PATENT DOCUMENTS

| | | | |
|---|---|---|---|
| 4,799,259 | 1/1989 | Ogrodski | 708/251 |
| 5,117,380 | 5/1992 | Tanagawa | 708/251 |
| 5,706,218 | 1/1998 | Hoffman | 708/251 |

*Primary Examiner*—David H. Malzahn
*Attorney, Agent, or Firm*—W. James Brady III; Richard L. Donaldson

[57] ABSTRACT

A random number generator includes a plurality of fully differential amplifiers (30) configured as a ring oscillator (22). The output of the ring oscillator (22) is input to a comparator/latch circuit (32) for determining the zero crossing for the ring oscillator. The ring oscillator is a self-oscillating structure that has an oscillation frequency with jitter superimposed thereon. This jitter is a result of the internal thermal noise associated with the integrated circuits that are utilized to realize the amplifiers (30). Each of the amplifiers (30) that make up the ring oscillator operate on a substantially constant current and are subsequently isolated from changes in the power supply. As such, the variations in the frequency thereof are caused solely by thermal noise. The comparator/latch circuit (32) is operable to compare the difference on the output of the last stage of the ring oscillator (22) and the output of the comparator/latch (32) is then sampled by a CPU (12) that is operated on a separate master clock (18). This allows the master clock (18), upon which the sample operation is based, to be completely separate from the ring oscillator (22).

8 Claims, 2 Drawing Sheets

RANDOM BINARY NUMBER GENERATOR

This application claims priority under 35 USC §119(e)(1) of provisional application Ser. No. 60/032,548 filed Dec. 5, 1996.

TECHNICAL FIELD OF THE INVENTION

The present invention pertains in general to a random number generator and, more particularly, to a random number generator utilizing a plurality of constant current differential amplifiers configured in a ring oscillator structure.

BACKGROUND OF THE INVENTION

Certain applications require a truly random number to be generated within an integrated system. Such applications are identification, access control, remote locks, encryption and audio (to generate noise). Typically, the random function is often approximated utilizing some type of algorithm that generates a long, fixed sequence of numbers, in a way that appears reasonably random. This algorithm can be implemented in hardware, one conventional method being to utilize a linear feed-back shift register, in which the binary output of some stages is combined with the input of other stages through EXOR gates and then fed back to the input. This algorithm can also be implemented in software, i.e., the same function can be accomplished through the use of a program that runs on. Since the sequence is not really random, but deterministic, this technique is often referred to as a pseudo-random number generator.

Another conventional technique for generating a random number is to time the duration of an external event, which is assumed to be uncorrelated to the clock frequency utilized by the system. A simple example of this technique is to time the duration of a key-press by a human user, utilizing the master clock of the microprocessor. Although the resulting number is actually deterministic, it does not appear as such due to the fact that the human user cannot normally press the key for the same duration each time. Although this technique may be sufficient in the field, it cannot easily be utilized to program a random number into an integrated circuit at the factory. An automated tester emulates the signal normally coming from a key-board.

One difficulty in generating a random number is the fact that an integrated circuit, whether analog or digital, is essentially designed to be deterministic in nature; for a given set of inputs, there will be a given set of outputs. However, one parameter of integrated circuits that is truly random is the thermal noise. Since the thermal noise constitutes a relatively small signal, it must be amplified to be utilized as a random noise source. However, this presents some difficulty in that any on-chip amplifier is subject to interference from other portions of the circuit, i.e., interference through the power supply or the substrate. This interference, as compared to the thermal noise, is not random. It is primarily determined by what other parts of the circuits do. It can either be periodic, if it is generated from a clock circuit, or it can be data dependent, if it is generated from data processing circuitry.

One technique for utilizing random noise is related to remote keyless entry integrated circuits. This technique utilizes two high-impedance voltage dividers to provide effective noise voltages in the tens of micro-volts, the output of which is amplified by a number of fully-differential, AC-couple, switched-capacitor gain stages. This provides an overall gain of approximately 1,000. The outputs of these gain stages are compared to each other utilizing a sensitive comparator. The output of the comparator alternates between a logic "1" and a logic "0" in a random fashion. In order to obtain an N-bit binary random number, the comparator output is sampled n times by the microprocessor (one bit for each sample). However, one disadvantage to this technique is that the entire random number generator is too large to be utilized effectively and also has an output that varies from a logic "1" to a logic "0" as a function of the random number generator. There is a possibility that there will be a locking between the random number generator oscillator frequency and that of the clock utilized for the sampling operation. This is due to the fact that the comparator and microprocessor are operated off of the same power supply.

SUMMARY OF THE INVENTION

The present invention disclosed and claimed herein comprises a random noise generator. The random noise generator includes a plurality of differential inverting amplifiers of an odd number. These inverting amplifiers are configured as a ring oscillator with the input of each of the inverting amplifiers output to the input of only one of another of the inverting amplifiers. Each of the inverting amplifiers operates with a substantially constant current drawn from a primary power supply. A comparator is provided for comparing the positive and negative difference output by one of the inverting amplifiers. When the difference is greater than a predetermined threshold, the comparator outputs a true logic signal. When the difference is less than the predetermined threshold, the comparator outputs a false logic signal. Sampling circuitry is provided for periodically sampling the comparator output n times to provide an N-bit binary word.

In another aspect of the present invention, the sampling circuitry includes an independent oscillator as a time base for the periodicity of the periodic sampling signal. This oscillator is powered from the primary power supply and is independent of the oscillation frequency of the ring oscillator.

In a further aspect of the present invention, the comparator includes a fully differential amplifier for receiving on the input thereof the output of the one inverting amplifier in the ring oscillator. This differential output from the one inverting amplifier is then amplified by the fully differential amplifier and the output thereof input to a latch circuit. The latch circuit is a CMOS logic circuit having an input threshold which, when exceeded, will cause the logic state on the output thereof to change between, a logic "1" and a logic "0".

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
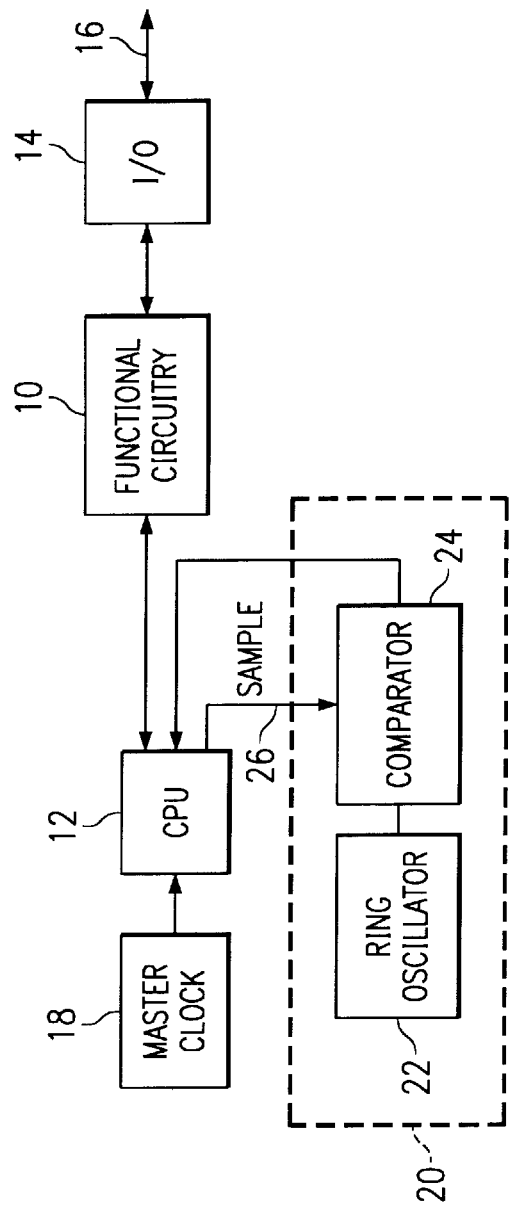
FIG. 1 illustrates an overall block diagram of the system utilizing the ring oscillator of the present invention.

Referring now to FIG. 1, there is illustrated a block diagram of an integrated circuit utilizing a functional circuit 10 that is controlled by a CPU 12, the functional circuit 10 and CPU 12 comprising the core of the integrated circuit. The functional circuit interfaces with the external pins of the integrated circuit through an input/output circuit 14, the pins represented by a bidirectional bus 16. The CPU 12 is controlled by a master clock 18, all aspects of the integrated circuit controlled by a single power supply (not shown). A random number generator 20 is utilized by the CPU 12 to develop a random binary number for use in operating the functional circuit 10. The random noise generator 20 is comprised of a ring oscillator 22 and a comparator 24. The ring oscillator 22 is operable to provide a relatively low frequency oscillation, the output of which is input to the comparator 24. The comparator 24 measures the amplitude of the output of the ring oscillator 22 which, as will be described hereinbelow, is, in part, a function of internal noise level. This noise is random, i.e., white noise, and, as such, the comparator output will have a random component in addition to the deterministic oscillator, varying between logic "1" and the logic "0" levels. The output of the comparator is sampled by the CPU 12 through a sample signal on a line 26. Additionally, the ring oscillator 22 is a substantially constant current circuit, such that current variations in the power supply are isolated from the operation of the ring oscillator 22. This will be described in more detail hereinbelow.

Figure 2:
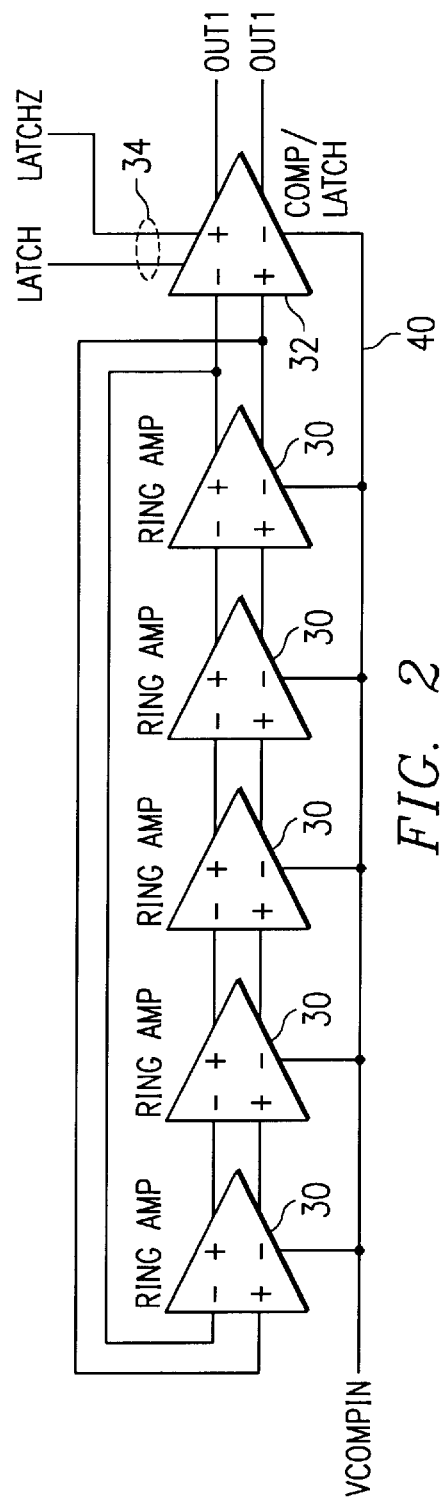
FIG. 2 illustrates a high level logic diagram for the ring oscillator and comparator of the present invention.

Referring now to FIG. 2, there is illustrated a high level logic diagram of the ring oscillator of the present invention. The ring oscillator is comprised of five inverting amplifiers 30 (any odd number greater than one being sufficient) to realize a fast ring oscillator. These inverting amplifiers 30 are connected in a ring configuration, with the positive output of the fifth amplifier 30 connected to the negative input of the first amplifier 30, the amplifiers 30 connected in a series configuration in an inverting manner. The output of the fifth amplifier 30 is input to a fully differential comparator 32 which receives on the input thereof latch signals on lines 34, which lines 34 comprise the sample signal on line 26 from the CPU 12. This provides a positive and negative output from the comparator 32.

The instantaneous value at one stage of the ring oscillator 22 is periodically sampled by the latch signals on lines 34 to produce a random number. The randomization is based on the assumption that the ring oscillator frequency is unrelated to the frequency of the sampling (in the preferred embodiment, this being dictated by the clock frequency of the master clock 18 controlling the microprocessor 12). In this case, the natural jitter of the ring oscillator, which jitter or random frequency is caused by thermal noise of the inverters, will cause the sample value to be random. Of course, in order to have a truly random output, it is important that the ring oscillator 22 and the master clock 18 are unrelated. It has always been a problem with integrated circuits that whenever two oscillators are fabricated on the same substrate, these oscillators tend to "lock", i.e., oscillate at frequencies that are an exact multiple of each other. This is due to the fact that switching at any frequency by any circuit results in a "kick" in the common power supply substrate voltage. Typically, this momentarily lowers the switching threshold of the oscillator, which causes it to change state as well. This oscillator "locking" is greatly reduced due to the use of fully-differential inverting amplifiers for the amplifiers 30, rather than a traditional CMOS logic inverter. It is well known that fully differential circuits have greatly increased immunity to common-mode interference, like supply or substrate coupling. This signal can then be compared with the comparator 32. This structure allows the amplitude of the oscillation to be relatively small, substantially below that of a logic level.

By utilizing a fully-differential approach, superior supply and substrate rejection is achieved. The bias currents of each of the amplifiers is chosen in such a way that a limited odd number of stages (3 or 5) would produce a fairly low oscillation frequency in the order of a few MHZ. It would be undesirable to have too high of a frequency on the integrated circuit. The bias is achieved by a bias input on a line 40. By utilizing constant current bias amplifiers, the oscillation frequency of the ring oscillator will remain relatively constant, independent of supply voltage, as opposed to the traditional approach. This, of course, is important in systems that must operate over a wide range of power supply voltages (2.7 to 6.0 volts in the preferred embodiment).

Figure 3:
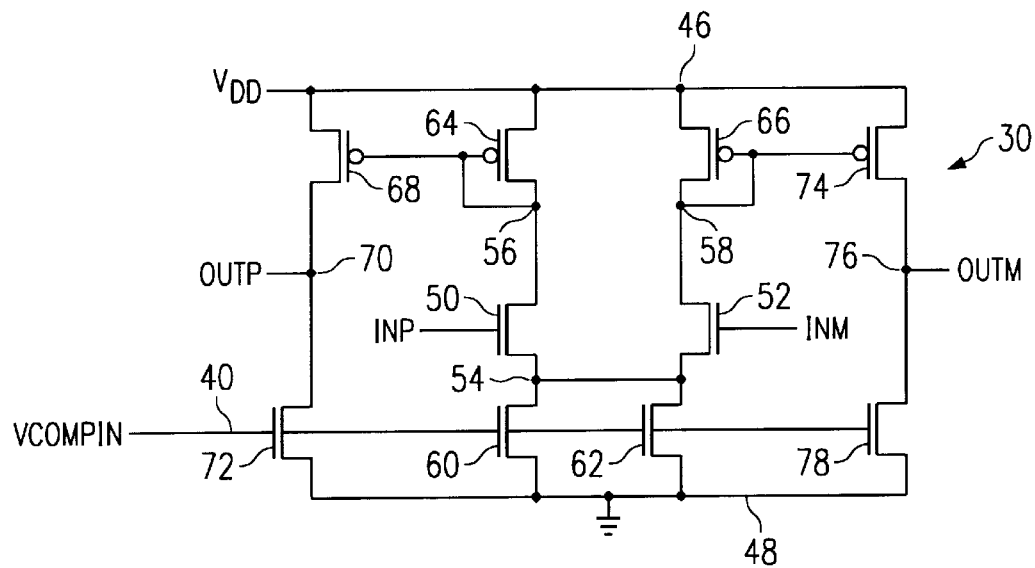
FIG. 3 illustrates a schematic diagram of the ring amplifier.

Referring now to FIG. 3, there is illustrated a schematic diagram of each of the amplifiers 30. The amplifiers are disposed between a power supply rail 46 having $V_{DD}$ connected thereto and a ground rail 48. A pair of differential input N-channel transistors 50 and 52 have the gates thereof connected to the respective positive and negative inputs, INP and INM, transistor 50 associated with the INP input and transistor 52 associated with the INM input. The sources of transistors 50 and 52 are connected to a common source node 54, with the drain of transistor 50 connected to a node 56 and the drain of transistor 52 connected to a node 58.

Common source node 54 is connected to the drains of two parallel connected N-channel transistors 60 and 62, the sources thereof connected to ground. Node 56 is connected through the source/drain path of a P-channel transistor 64 to the power supply rail, the gate thereof connected to node 56. Similarly, the node 58 is connected to the source/drain path of a P-channel transistor 66 to the power supply rail 46, the gate thereof connected to node 58. The node 56 is also connected to the gate of the P-channel transistor 68, the source/drain thereof connected between the power supply rail 46 and an output node 70 to provide the positive output OUTP. Node 70 is connected to the drain of an N-channel transistor 72, the source thereof connected to ground and the gate thereof connected to the gates of transistors 60 and 62 and also to an external bias input, the bias voltage VCOM-PIN on the line 40. In a similar manner, the node 58 is connected to the gate of the P-channel transistor 74, the source/drain path thereof connected between the power supply rail 46 and an output node 76 with a minus output OUTM. Node 76 is connected to the drain of an N-channel transistor 78, the source thereof connected to ground and the gate thereof connected to the bias input line 40.

Each of the transistors in the amplifier of FIG. 3 has a width and a length, which defines the effective size of the transistor relative to other transistors. Typically, the wider a transistor is, the more power handling capability it has relative to other transistors. The transistors will be defined with respect to their width/length ratio to show the relative sizes thereof. Transistors 64, 66, 68, 74, 50, 52, 60 and 62 each have a W/L ratio of 5/3. Transistors 72 and 72 have a W/L ratio of 4/3.

Figure 4:
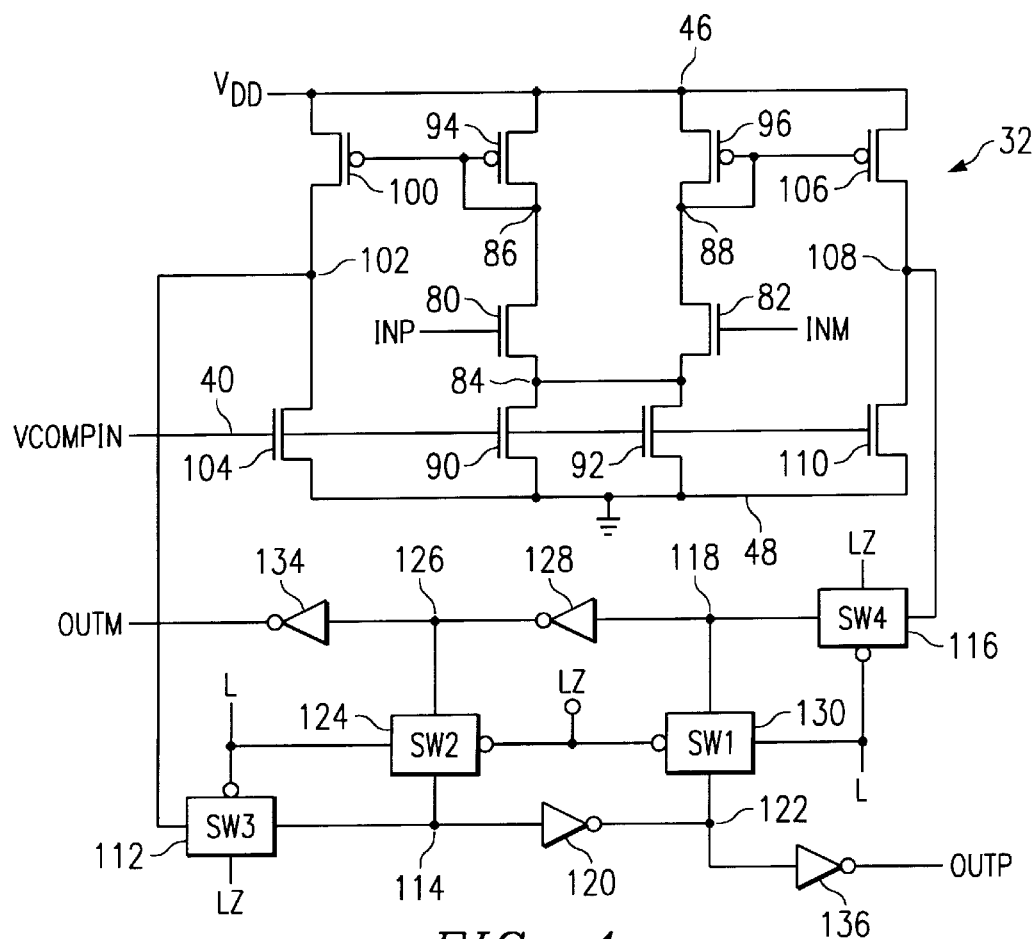
FIG. 4 illustrates a schematic diagram of the comparator/latch.

Referring now to FIG. 4, there is illustrated a schematic diagram of the comparator/latch 32. The input is comprised of a pair of differential N-channel transistors 80 and 82, transistor 80 having the gate thereof connected to the INP positive input and the source thereof connected to a common source node 84 and the drain thereof connected to a node 86. Transistor 82 has the source thereof connected to the common source 84 and the drain thereof connected to a node 88, the gate thereof connected to the negative input INM of the comparator/latch 32. The common source 84 is connected to the drains of two N-channel transistors 90 and 92, the gates thereof connected to the bias line 40 and the sources thereof connected to ground. Node 86 is connected through the source/drain path of a P-channel transistor 94 to the power supply rail 46, the gate thereof connected to the node 86. Similarly, the node 88 is connected through the source/drain path of a P-channel transistor 96 to the power supply rail 46, the gate thereof connected to the node 88. Node 86 is connected to the gate of a P-channel transistor 100, the source/drain path thereof connected between the power supply rail 46 and a positive output node 102. Node 102 is connected to the drain of an N-channel transistor 104, the gate thereof connected to the bias terminal 40 and the source thereof connected to ground. The node 88 is connected to the gate of a P-channel transistor 106, the source/drain path thereof connected between the power supply rail 46 and a negative output node 108. Node 108 is connected to the drain of an N-channel transistor 110, the gate thereof connected to the bias line 40 and the source thereof connected to ground.

The positive output node 102 is connected to a switch 112, the other side of switch 112 connected to a latch node 114. Switch 112 is labeled "SW3" and is controlled by a latch signal L and an inverse latch signal LZ. The switch operates such that, whenever the latch signal is high, the switch 112 will not conduct. Similarly, the node 108 is connected to one side of a switch 116, the other side thereof connected to a latch node 118. Switch 116 is controlled by the L and LZ signals, such that when the latch signal goes high, the switch 116 labeled "SW4" does not conduct. Latch node 114 is connected to the input of an inverter 120, the output thereof connected to a latch node 122. Node 114 is also connected to one side of a switch 124 labeled "SW2", the other side of switch 124 connected to a latch node 126. Switch 124 is controlled by the L and LZ signals and conducts whenever the latch signal L is high. The node 118 is connected to the input of an inverter 128, the output thereof connected to the latch node 126. Latch node 122 is connected to the input of a switch 130, the other side thereof connected to the latch node 118, switch 130 labeled "SW1" and controlled by the L and LZ signals. Whenever the latch signal L is high, the switch 130 conducts. The latch node 126 is connected to the input of an inverter 134, the output thereof providing the OUTM output for the comparator/latch circuit 32. This is a driver function. Similarly, the latch node 122 is connected to the input of an inverter 136, the output thereof providing the OUTP output of the comparator/latch circuit 32.

The W/L ratios with the transistors in the comparator/latch 32 differs somewhat from those in the differential amplifier of FIG. 3. The transistors 80, 82, 90, 92, 94 and 96 each have a W/L ratio of 5/3, similar to that described above with respect to the differential amplifier of FIG. 3. However, the P-channel transistors 100 and 106 and the N-channel transistors 104 and 110 have a W/L ratio of 5/1 to better drive the latch and improve the symmetric aspect of the duty-cycle.

In operation, the differential amplifier 32 will have a voltage differential on the output nodes 102 and 108 that is a function of the voltage differential on the inputs to the gates of transistors 80 and 82. When the latch signal is not present, the switches 112 and 116 will conduct, connecting node 102 to the latch node 114 and output node 108 to the latch node 118. Whenever the respective voltages on the output nodes 102 and 108 rises above or below the switching threshold of the input transistors (not shown) of the inverters 120 and 128, the outputs thereof will change state to either a logic "1" or a logic "0". These inverters 120 and 128 typically utilize a two transistor CMOS configuration. Whenever it is desirable to sample the comparator output, the latch signal is raised high, turning off switches 112 and 116 and turning on switches 124 and 130. This will effective "latch" the logic state therein. It is noted that this operation does not effect the differential amplifiers 32 of FIG. 3.

In summary, there has been provided a random noise generator that utilizes a plurality of fully differential amplifiers configured as a ring oscillator. An odd number of amplifiers are configured in the ring oscillator structure with the output of one of the amplifiers input to a comparator. The oscillator frequency of the ring oscillator has a frequency that has superimposed thereupon jitter that is a result of thermal noise. This jitter is reflected on the output of the comparator 32.

Although the preferred embodiment has been described in detail, it should be understood that various changes, substitutions and alterations can be made therein without departing from the spirit and scope of the invention as defined by the appended claims.

What is claimed is:

1. A random noise generator, comprising:
    a plurality of differential inverting amplifiers of an odd number from "1" to "M" each with differential inputs and outputs and configured as a ring oscillator, with the output of each of said differential inverting amplifiers input to the input of only one of another of said differential inverting amplifiers, the output of said Mth differential inverting amplifier connected to the input of the first of said differential inverting amplifiers;
    each of said differential inverting amplifiers operating with a substantially constant current and having thermal noise jitter associated therewith;
    a comparator for comparing the positive and negative differential outputs of one of said differential inverting amplifiers and, when said difference is greater than a predetermined threshold, outputting a true logic signal, and when said difference is less than said predetermined threshold, outputting a false logic signal; and
    sampling circuitry for generating a sampling signal for sampling said comparator output N times to provide an N-bit random binary word.

2. The random noise generator of claim 1, wherein said comparator comprises:
    a differential comparator amplifier for amplifying the output of the one of said differential inverting amplifiers to provide an amplified differential output voltage; and
    a latch circuit having an internal threshold which, when the voltage difference exceeds said internal threshold, the output thereof will change logic states between a logic "1" and a logic "0", said latch operable to latch the contents therein upon receiving a latch signal from said sampling circuitry.

3. The random noise generator of claim 1, wherein said sampling circuitry further includes an independent oscillator that is powered from a power supply that is the same as the power supply that powers said differential inverting amplifiers, said oscillator providing a time base utilized in generating said sampling signal by said sampling circuitry.

4. The random noise generator of claim 3, wherein said sampling circuitry comprises a processing unit for interfacing with external functional circuitry, said processing unit generating said sampling signal and controlled by said oscillator.

5. The random noise generator of claim 1, wherein each of said inverting amplifiers comprises a differential amplifier having:
- a pair of first and second differential input MOS transistors having the sources thereof connected to a common source node;
- a current source connected between said common source node and a ground terminal;
- a first active load disposed between the drain of said first differential input transistor and a positive power supply rail,
- a second active load connected between the drain of said second differential input transistor and the power supply rail; and
- bias circuitry for biasing said first and second active loads and said constant current source, the gates of said first and second differential transistors comprising the positive and negative inputs to said differential amplifier.

6. The random noise generator of claim 1, wherein the value of "M" comprises five.

7. A method for generating random noise, comprising the steps of:
- providing a plurality of differential inverting amplifiers of an odd number from "1" to "M", each having differential inputs and outputs;
- configuring the differential inverting amplifiers in a ring oscillator configuration, with the output of each of the differential inverting amplifiers input to the input of only one of another of the differential inverting amplifiers, the output of the Mth differential inverting amplifier connected to the input of the first of the differential inverting amplifiers, such that an oscillatory condition will exist;
- operating each of the differential inverting amplifiers in a substantially constant current mode of operation with each of the differential inverting amplifiers having thermal noise jitter associated therewith;
- comparing the positive and negative differential outputs of one of the inverting amplifiers in the ring configuration and, when the difference is greater than a predetermined threshold, outputting a true logic signal, and when the difference is less than the predetermined threshold, outputting a false logic signal; and
- sampling the comparator output N times to provide an N-bit random binary word in response to the generation of a sampling signal by sampling circuitry.

8. The method of claim 7, and further comprising generating an independent oscillating signal with an independent oscillator and powering the independent oscillator from a power supply that is the same power supply that powers the differential inverting amplifiers.

* * * * *